(12) United States Patent
Chen et al.

(10) Patent No.: US 10,237,986 B2
(45) Date of Patent: Mar. 19, 2019

(54) SHELL STRUCTURE FOR THYRISTOR TRIGGER UNIT

(71) Applicants: NR ELECTRIC CO., LTD, Jiangsu (CN); NR ENGINEERING CO., LTD, Jiangsu (CN); NR ELECTRIC POWER ELECTRONICS CO., LTD., Jiangsu (CN)

(72) Inventors: Chihan Chen, Jiangsu (CN); Taixun Fang, Jiangsu (CN); Fan Yang, Jiangsu (CN); Biao Gao, Jiangsu (CN); Lele Li, Jiangsu (CN); Lei Liu, Jiangsu (CN)

(73) Assignees: NR ELECTRIC CO., LTD, Jiangsu (CN); NR ENGINEERING CO., LTD, Jiangsu (CN); NR ELECTIC POWER ELECTRONICS CO., LTD., Jiangsu (CN)

( * ) Notice: Subject to any disclaimer, the term of this patent is extended or adjusted under 35 U.S.C. 154(b) by 0 days.

(21) Appl. No.: 15/748,613

(22) PCT Filed: Jul. 13, 2016

(86) PCT No.: PCT/CN2016/089943
§ 371 (c)(1),
(2) Date: Jan. 29, 2018

(87) PCT Pub. No.: WO2017/016391
PCT Pub. Date: Feb. 2, 2017

(65) Prior Publication Data
US 2018/0302993 A1 Oct. 18, 2018

(30) Foreign Application Priority Data

Jul. 28, 2015 (CN) .......................... 2015 1 0451692

(51) Int. Cl.
H05K 5/00 (2006.01)
H05K 7/14 (2006.01)

(52) U.S. Cl.
CPC ......... *H05K 5/0008* (2013.01); *H05K 7/1407* (2013.01)

(58) Field of Classification Search
CPC combination set(s) only.
See application file for complete search history.

(56) References Cited

U.S. PATENT DOCUMENTS 4,506,198 A * 3/1985 Savas ................. H01H 9/061
388/838
4,595,939 A * 6/1986 Yamaguchi ......... H01L 31/1113
257/115

(Continued)

FOREIGN PATENT DOCUMENTS

CN 101719719 A 6/2010
CN 201830591 U 5/2011

(Continued)

OTHER PUBLICATIONS

State Intellectual Property Office, P.R. China, Decision to Grant dated Aug. 5, 2016 with English translation in Chinese Patent Application No. CN201510451692.6, 5 pages.

(Continued)

*Primary Examiner* — Lisa Lea-Edmonds
(74) *Attorney, Agent, or Firm* — Masuvalley & Partners

(57) ABSTRACT

A shell structure for a thyristor trigger unit comprises an integrally-formed shell body with a holder and a cuboid structure, and a side plate. The cuboid structure is a cuboid with an opening in its front where an open face is formed at the front opening of the cuboid. The cuboid further includes a rear panel, a left panel, a right panel, an upper panel, and a lower panel. The holder includes a square retaining plate and two triangular stiffener plates. The square retaining plate (Continued)

is formed by a bottom panel extending towards a side of the left panel in a long side direction of the cuboid while the triangular stiffener plates are fixedly connected between the square retaining plate and the left panel. The side plate is mated with and detachably mounted on the open face to produce a sealed 6-face cuboid structure by sealing off said open face.

9 Claims, 1 Drawing Sheet

(56) References Cited

U.S. PATENT DOCUMENTS

| | | | | |
|---|---|---|---|---|
| 5,091,823 A * | 2/1992 | Kanbara | ............... | H02M 5/44 174/351 |
| 8,289,113 B2 * | 10/2012 | Miller | ............... | H02P 1/18 200/307 |
| 8,653,649 B2 * | 2/2014 | Tsujino | ............... | H01L 23/057 257/664 |
| 9,832,893 B2 * | 11/2017 | Yamada | ............... | H05K 5/0047 |
| 2012/0147539 A1 * | 6/2012 | Tsujino | ............... | H01L 23/057 361/679.01 |

FOREIGN PATENT DOCUMENTS

| | | |
|---|---|---|
| CN | 103269169 A | 8/2013 |
| CN | 104158521 A | 11/2014 |
| CN | 203950808 U | 11/2014 |
| CN | 104219943 A | 12/2014 |
| CN | 204168154 U | 2/2015 |
| CN | 105025671 A | 11/2015 |
| CN | 204887748 U | 12/2015 |
| JP | 2017059695 A * | 3/2017 ........... H05K 5/0047 |

OTHER PUBLICATIONS

State Intellectual Property Office, P.R. China, First Office Action dated Jun. 20, 2016 with English translation in Chinese Patent Application No. CN201510451692.6, 10 pages.

International Search Authority/CN, International Search Report dated Oct. 25, 2016 in International Patent Application No. PCT/CN2016/089943 (with English translation), 4 pages.

* cited by examiner

SHELL STRUCTURE FOR THYRISTOR TRIGGER UNIT

RELATED APPLICATIONS

This application is a National Stage Application, filed under 35 U.S.C. 371, of International Application No. PCT/CN2016/089943 filed Jul. 13, 2016, which claims priority to Chinese Application No. 201510451692.6 filed Jul. 28, 2015, which are hereby expressly incorporated by reference in their entirety for all purposes.

TECHNICAL FIELD

The present invention relates to the field of components of a power system, and in particular, to a shell structure for a thyristor trigger unit.

BACKGROUND

In a high-voltage DC converter valve, performance of a thyristor trigger unit is of utmost importance. In some DC projects, an exposed TE plate is directly installed in a converter valve. Although the installation is convenient and space-saving is achieved with this approach, the stain-resistant and anti-interference capabilities are relatively poor, and a fault may occur after prolonged operation.

Other thyristor trigger units for the converter valve may be installed in the following manner: A main trigger circuit board is packaged in a shell, and then, the shell is screw-fixed on a radiator at a valve layer. A detachable panel of the trigger unit is located at a bottom part of the shell, and the main circuit board is fixed on an inner side face of the shell. The following problems are found during implementation.

First, when the main trigger circuit board is being fixed inside the shell, because the shell body is relatively flat and anchor screws are located on a side of the shell, it is difficult to reach into the shell with a hand to align anchor points on the circuit board with those on the shell.

Second, during commissioning, when it is required to use an oscilloscope to measure an onboard signal, it is difficult to extend a probe from a relatively narrow bottom face into the shell to perform measurement.

The thyristor trigger unit used in an ice-melting project is also of a flat cuboid structure. It comprises a bottom retaining plate and an upper housing. A main circuit board is installed on the rectangular retaining plate, and the cuboid upper housing covers the main circuit board. Several holes are formed on the upper housing for passage of optical fibers and cables. The trigger unit is fixed via a small portion extending from the bottom retaining plate.

Such a shell structure of the thyristor trigger unit facilitates installation and fixation of the circuit board inside the shell, but has some disadvantages:

First, because the bottom retaining plate is relatively broad, and the extension is also relatively broad, a large installation and fixing space is required, and the shell is not applicable when a relatively narrow radiator is used in a relatively compact valve.

Second, because optical fibers and cables go through the holes on the upper housing, when the upper housing needs to be removed during commissioning of the thyristor trigger unit, the optical fibers and the cables need to be disconnected as well, and as a result need to be reconnected after the commissioning, bringing about great troubles to the commissioning.

SUMMARY

An objective of the present invention is to provide a shell structure for a thyristor trigger unit that has a simple structure, requires a small installation and fixing space, facilitates commissioning, and has a strong anti-interference capability.

To achieve the foregoing objective, the following technical solutions are used in the present invention. A shell structure for a thyristor trigger unit includes a shell body and a side plate, where the shell body is integrally-formed which comprises a holder and a cuboid structure;

the cuboid structure is a cuboid having an opening at the front, the cuboid includes a rear panel, a left panel, a right panel, an upper panel, and a lower panel, and an open face is formed at the front opening of the cuboid;

the holder includes a square retaining plate and two triangular stiffener plates, and the square retaining plate is formed by a bottom panel extending towards a side of the left panel in a long side direction of the cuboid;

the triangular stiffener plates are fixedly connected between the square retaining plate and the left panel; and the side plate is mated with and detachably mounted on the open face, to seal off the open face and form a closed six-face cuboid structure.

Further, at least one screw hole used to fix a trigger circuit board on the rear panel is disposed on the rear panel.

Further, at least one weep hole used to discharge water that accidentally enters a thyristor trigger unit in time is formed on the lower panel.

Further, at least one power cable hole for passing of power cables is formed on the lower panel. A main circuit board is connected to a main circuit at a valve layer via several cables extending out of the power cable holes for the purpose of receiving power.

Further, a thyristor trigger line hole for passing of a thyristor trigger line is formed on the left panel. The thyristor trigger unit sends a trigger electrical impulse to a thyristor gate via a trigger line extending out of the thyristor trigger line hole.

Further, two optical fiber holes for passing of one trigger optical fiber and one feedback optical fiber are formed on the right panel. Each of the two optical fiber holes corresponds respectively to one feedback optical fiber interface and one trigger optical fiber interface.

Further, at least one fixing rod is disposed inside the cuboid, one end of the at least one fixing rod is a threaded rod, the other end has an internal screw hole, and the threaded rod is mated with a screw hole on the rear panel.

Further, at least one installation screw hole is formed on the side plate, and the side plate is fixed on the open face via at least one screw, the at least one installation screw hole, and the at least one fixing rod.

Further, at least one fixing screw hole used to fix the shell body on a radiator at a valve layer is formed on the square retaining plate.

By using the foregoing solutions, the present invention has the following beneficial effects: 1. the fixation of a shell and the installation of a circuit board are facilitated; 2. signal measurement and commissioning in a circuit board is facilitated; 3. drainage in the case of water leakage inside a valve is facilitated.

DESCRIPTION OF EMBODIMENTS

Embodiment 1

Figure 1:
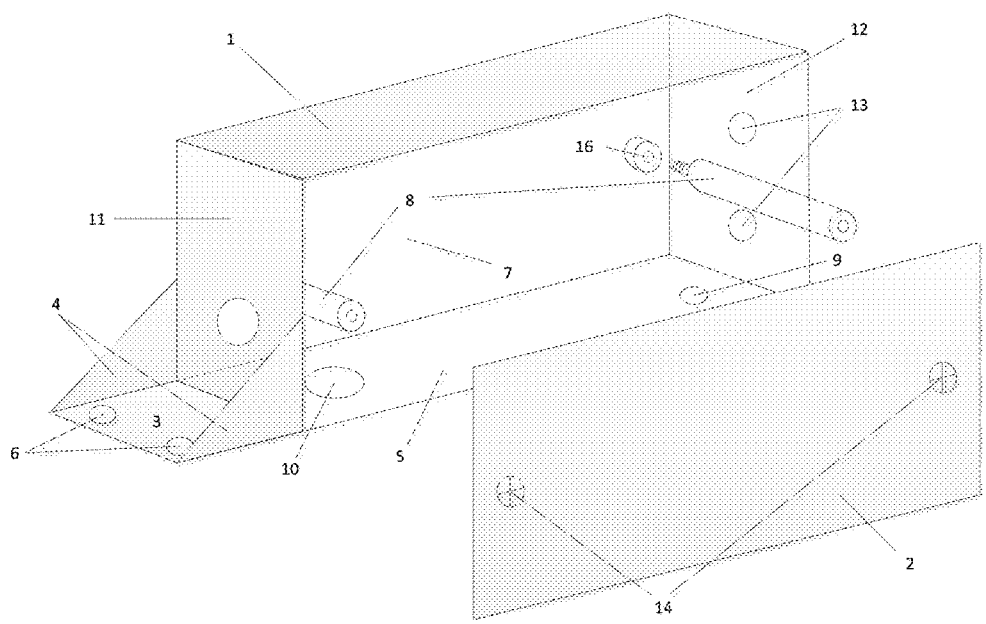
FIG. 1 is a schematic 45-degree view of a shell structure for a thyristor trigger unit.
Figure 2:
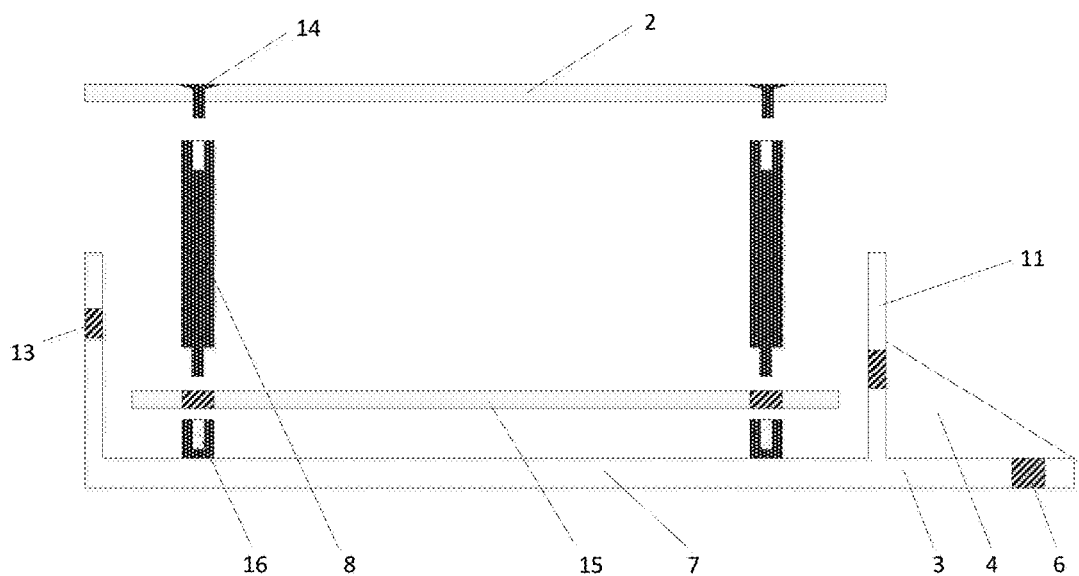
FIG. 2 is a side view of a thyristor trigger unit.

Referring to FIG. 1 and FIG. 2, a shell structure for a thyristor trigger unit includes a shell body and a side plate 2. The shell body is integrally-formed which comprises a holder and a cuboid structure. The cuboid structure is a cuboid having an opening at the front. The cuboid includes a rear panel 7, a left panel 11, a right panel 12, an upper panel 1, and a lower panel 5. An open face is formed at the front opening of the cuboid. The holder includes a square retaining plate 3 and two triangular stiffener plates 4. The square retaining plate 3 is formed by the lower panel 5 extending towards a side of the left panel 11 in a long side direction of the cuboid. The triangular stiffener plates 4 are fixedly connected between the square retaining plate 3 and the left panel 11. The side plate 2 is mated with and detachably mounted on the open face to seal off the open face and form a closed six-face cuboid structure.

In a preferable solution, at least one screw hole 16, used for fixing a trigger circuit board 15 on the rear panel 7, is disposed on the rear panel 7. At least one weep hole 9, used for discharging water that accidentally enters the thyristor trigger unit in time, is formed on the lower panel 5. At least one power cable hole 10 for passing of power cables is formed on the lower panel 5. A main circuit board is connected to a main loop at a valve layer via several cables extending out of the power cable holes for the purpose of receiving power. A thyristor trigger line hole for passing of a thyristor trigger line is formed on the left panel 11. The thyristor trigger unit sends a trigger electrical impulse to a thyristor gate via a trigger line extending out of the thyristor trigger line hole. Two optical fiber holes 13 are formed on the right panel 12 for passing of one trigger optical fiber and one feedback optical fiber. The two optical fiber holes correspond respectively to one feedback optical fiber interface and one trigger optical fiber interface. At least one fixing rod 8 is disposed inside the cuboid, one end of the at least one fixing rod 8 is a threaded rod, the other end has an internal screw hole, and the threaded rod is mated with a screw hole 16 on the rear panel 7. At least one installation screw hole 14 is formed on the side plate 2, and the side plate 2 is fixed on the open face via at least one screw, the at least one installation screw hole 14, and the at least one fixing rod 8. At least one fixing screw hole 6 used to fix the shell body on a radiator at the valve layer is formed on the square retaining plate 3.

The present invention has been described according to particular exemplary embodiments. Obviously, a person skilled in the art may make appropriate substitution or modification without departing from the scope of the present invention. The exemplary embodiments are merely for illustration, rather than limiting the scope of the present invention. The scope of the present invention is defined by the appended claims.

What is claimed is:

1. A shell structure for a thyristor trigger unit, comprising a shell body and a side plate, wherein:
    the shell body is integrally formed and comprising a holder and a cuboid structure, said cuboid structure is a cuboid having an opening at the front, the cuboid comprises a rear panel, a left panel, a right panel, an upper panel, and a lower panel, and an open face is formed at the front opening of the cuboid;
    the holder comprises a square retaining plate and two triangular stiffener plates, and the square retaining plate is formed by a bottom panel extending towards a side of the left panel in a long side direction of the cuboid;
    the triangular stiffener plates are fixedly connected between the square retaining plate and the left panel; and
    the side plate is mated with and detachably mounted on the open face, to seal off the open face.

2. The shell structure for a thyristor trigger unit according to claim 1, wherein at least one screw hole used to fix a trigger circuit board on the rear panel is disposed on the rear panel.

3. The shell structure for a thyristor trigger unit according to claim 1, wherein at least one weep hole used to discharge water that accidentally enters a thyristor trigger unit in time is formed on the lower panel.

4. The shell structure for a thyristor trigger unit according to claim 3, wherein at least one power cable hole for passing of power cables is formed on the lower panel.

5. The shell structure for a thyristor trigger unit according to claim 1, wherein a thyristor trigger line hole for passing of a thyristor trigger line is formed on the left panel.

6. The shell structure for a thyristor trigger unit according to claim 1, wherein two optic fiber holes for passing of a trigger optic fiber and a feedback optic fiber are formed on the right panel.

7. The shell structure for a thyristor trigger unit according to claim 2, wherein at least one fixing rod is disposed inside the cuboid, one end of the at least one fixing rod is a threaded rod, the other end thereof has an internal screw hole, and the threaded rod is mated with a screw hole on the rear panel.

8. The shell structure for a thyristor trigger unit according to claim 7, wherein at least one installation screw hole is formed on the side plate, and the side plate is fixed on the open face via at least one screw, the at least one installation screw hole, and the at least one fixing rod.

9. The shell structure for a thyristor trigger unit according to claim 1, wherein at least one fixing screw hole used to fix the shell body on a radiator at a valve layer is formed on the square retaining plate.

* * * * *